United States Patent [19]
Yim

[11] Patent Number: 5,930,196
[45] Date of Patent: Jul. 27, 1999

[54] MULTI-BANK MEMORY DEVICE WITH COMPENSATION FOR LINE LOADING

[75] Inventor: Sung-Min Yim, Pyongtaek, Rep. of Korea

[73] Assignee: Samsung Electronics, Co., Ltd., Suwon, Rep. of Korea

[21] Appl. No.: 08/896,080

[22] Filed: Jul. 17, 1997

[30] Foreign Application Priority Data

Jul. 18, 1996 [KR] Rep. of Korea .................. 96-29038

[51] Int. Cl.[6] .................................................. G11C 8/00
[52] U.S. Cl. ........................ 365/230.06; 365/230.03; 326/108; 326/106
[58] Field of Search .................. 365/230.06, 230.03; 326/108, 106

[56] References Cited

U.S. PATENT DOCUMENTS

| 5,467,032 | 11/1995 | Lee ............................... 326/88 |
| 5,517,456 | 5/1996 | Chishiki ..................... 365/230.03 |

Primary Examiner—David Nelms
Assistant Examiner—Andrew Q. Tran
Attorney, Agent, or Firm—Marger Johnson, McCollom P.C.

[57] ABSTRACT

A local column selection line driving circuit in a multi-bank memory device is shown which includes a first transistor coupled between a bank selection line and a circuit node and wherein a gate of the first transistor is coupled to a power supply voltage such that a non-inverting bank selection signal received on the bank selection line precharges the circuit node to a first voltage level. The local column selection line driving circuit also includes a second transistor coupled between a global column selection line and a local column selection line and having a gate terminal coupled to the circuit node such that a global column selection signal received on the global column selection line boosts the circuit node to a voltage level higher than the first voltage level. The circuit node then drives the global column selection signal onto the local column selection line through the second transistor. When multiple memory banks of a memory circuit constructed with the local column selection driving circuit are addressed then the charge consumption of the non-inverting bank selection signal on the bank selection line is compensated and line loading is reduced.

6 Claims, 5 Drawing Sheets

MULTI-BANK MEMORY DEVICE WITH COMPENSATION FOR LINE LOADING

BACKGROUND OF THE INVENTION

1. Field of the Invention

This invention relates to a multi-bank memory device, and more particularly to a multi-bank memory device having a precharging function to compensate for the reduction of a column selection line driving voltage caused by line-loading when a bank address is designated.

2. Description of the Prior Art

Generally, high speed and density memory devices are implemented with a multiple bank structure wherein each block of memory for a data bit line is divided into a plurality of memory banks where each memory bank contains a memory cell array arranged in rows and columns.

FIG. 1 is a block diagram illustrating a conventional semiconductor memory device having a multiple bank structure. The multiple bank structure of FIG. 1 includes a block of memory for each of data bits DQ0–DQn. Each of the memory blocks for data bits DQ0–DQn includes memory bank blocks BANK0 and BANK1. The column decoders CD0–CDn are shared by both the memory banks BANK0 and BANK1 for each one of the memory blocks for data bits DQ0–DQn. A global selection line 10 is output by each one of column decoders CD0–CDn in order to access a column of memory in the memory cells of memory banks BANK0 and BANK1 for each of the memory blocks for data bits DQ0–DQn. However, the row-decoders BD0–BD1 provided to select each bank BANK0 and BANK1 are shared across all the memory blocks for data bits DQ0–DQn.

FIG. 2 is a schematic circuit diagram further explaining the conventional multiple bank memory device of FIG. 1. In FIG. 2, BANK0 and BANK1 are composed of multiple subcircuits of the same type, such as subcircuit 100. Subcircuit 100 includes a local column section line driving circuit 110, coupled between a global column section line 10 output from one of the column decoders CD0–CDn and a ground potential voltage level, for producing a column selection control signal in response to non-inverted and inverted bank selection signals, such as the Bank0 signal 20A and Bank0B signal 20B. Here, the non-inverted and inverted bank signals 20A and 20B transition between a voltage level VPP, typically provided by a voltage generator internal to the memory chip, and the ground potential voltage level. The on-chip voltage generator used to produce VPP typically have a limited drive capacity.

A column selection section 120 is coupled between a local input/output bus 30 and the memory cells of the memory array for each memory bank, such as memory bank BANK0 which includes transistors M3–M6 that are driven simultaneously in response to the local column selection control signal LCSL. A global input/output bus 40 is coupled to the local input/output bus 30 and includes sense amplifier (not illustrated) for amplifying the bit signals for data bits DQ0–DQn transmitted on the local input/output bus 30.

FIG. 3 is a circuit diagram illustrating the conventional local column selection line driving circuit 110 shown in FIG. 2. The local column selection line driving circuit 110 includes a first N-channel metal oxide semiconductor (NMOS) transistor M1 having drain terminal coupled to the global column selection line GCSL, a source terminal coupled to the local column selection line LCSL, and a gate terminal coupled to the non-inverted bank selection line 20A. The conventional local column selection line driving circuit 110 also includes a second NMOS transistor M2 having a drain terminal coupled to the local column selection line LCSL, a drain terminal coupled to ground, and a gate terminal coupled to the inverted bank selection line 20B.

The operation of the prior art memory device will be explained with reference to FIGS. 1, 2 and 3. When the global selection line GCSL is activated by one of the column decoders CD0–CDn and the non-inverted bank selection line 20A is active to select BANK0, in this example, the first NMOS transistor M1 is turned on, since a VDD reference voltage is applied to the drain terminal of transistor M1 while the VPP voltage level applied to the non-inverted bank selection line 20A is also applied to the gate terminal of transistor M1. At the same time, the inverted bank selection line 20B applies a ground potential voltage level to the gate of the second NMOS transistor M2 which is thereby turned off. Thus the local column selection line driving circuit 110 pulls the local column selection line LCSL up to the VDD voltage level at the drain terminal.

Because the local column selection line LCSL is active, NMOS transistors M3–M6 are turned on simultaneously and the bit signals of the cells of BANK0 are loaded onto the global input/output bus 40 through the local input/output bus 30, as shown in FIG. 2. The signals loaded on the global input/output bus 40 are then amplified by sense amplifiers (not illustrated).

FIG. 4 shows a timing diagram for the conventional memory device. After the row address strobe signal RASB transitions into an active low state, the VPP voltage level is applied to the bank selection lines 20A and 20B to select one of memory banks BANK0 or BANK1. As the global column select line GCSL 10 is activated in order to access successive locations of cells in the memory cell arrays in the selected memory bank for each of data bits DQ0–DQn, the voltage level of VPP typically deteriorates responsive to the column address select signal CASB successively activating local column select lines which draw on the VPP voltage applied to the bank selection line 20A. The VPP voltage of non-inverted bank selection line 20A steadily deteriorates because of the increased loading presented by each successive memory bank that is activated. The on-chip voltage generator that is used to produce VPP typically cannot compensate for the consumption of the VPP voltage charge level caused by the bank address being continually changed by the column address select signal CASB during a long row address strobe RASB active period. Therefore, VPP-related failure of the chip may occur.

Furthermore, the cycle time for the pumping operation and the precharging operation of the pumping capacitance of the VPP generator, which is controlled by the column address strobe signal CASB during the long row address strobe RASB active period, should be reduced whenever possible in order to improve the performance of the chip.

SUMMARY OF THE INVENTION

It is an object of the present invention to provide a multiple bank memory device which avoids a drop in a column selection line driving voltage caused by line-loading from accessing multiple memory banks.

In one embodiment of the present invention, a local column selection line driving circuit is shown for a multi-bank memory device where the local column selection line driving circuit includes a pull-down device coupled between a local column selection line and a ground potential terminal which has a gate terminal configured to receive an inverted bank selection signal. The local column selection line driving circuit also includes a pull-up device coupled between a global column selection signal and the local column selection line and a precharging device having a first terminal configured to receive a non-inverted bank selection signal, a second terminal coupled to a gate terminal of the pull-up device, and wherein a gate terminal of the precharging device is configured to receive a power supply voltage such that the gate terminal of the pull-up device is precharged to a first voltage level in response to the non-inverted bank selection signal.

In another aspect of the present invention, there is provided a multi-bank memory device which includes a plurality of cell arrays, a plurality of array groups composed of the plurality of cell arrays, a plurality of memory blocks composed of the plurality of array groups, a plurality of memory banks composed of the plurality of memory blocks, and a plurality of row decoders for producing bank selection signals of a complementary metal oxide semiconductor (CMOS) active threshold level for output to a plurality of bank selection lines in order to select one of the plurality of memory banks and select a word line of one of the plurality of cell arrays in the selected one of the plurality of memory banks. The memory device also includes a plurality of column decoders for producing global column selection signals of the CMOS level for output to a plurality of global column selection lines in order to select one column in each of the plurality of array groups in each of the plurality memory blocks in the selected one of the plurality of memory banks. The memory device is further constructed to have a plurality of global input/output lines wherein each one of the plurality of global input/output lines is coupled to a corresponding column in each one of the plurality of cell arrays and to have a plurality of local input/output lines wherein each one of the plurality of local input/output lines couples one of the plurality of global input/output lines to the corresponding column in one of the plurality of cell arrays. Finally, the memory device includes a plurality of local column selection lines wherein each one of the plurality of local column selection lines is coupled between one of the plurality of local input/output lines and one of the plurality of cell arrays and a plurality of local column selection line circuits wherein each one of the plurality of local column selection line circuits couples one of the global column selection lines to one of the plurality of local column selection lines, and wherein each one of the plurality of local column selection line circuits is configured to drive the corresponding one of the plurality of local column selection lines with the voltage of the CMOS level applied to the corresponding global column selection line in response to the bank selection signals.

An embodiment of a method for driving a local column selection line in a multiple memory bank structure, according to the present invention, includes the steps of precharging a node to a first voltage level responsive to a non-inverting bank selection signal, boosting the node to a second voltage level greater than the first voltage level responsive to a global column selection signal, and driving the global column selection signal onto the local column selection line using the second voltage level at the node.

BRIEF DESCRIPTION OF THE DRAWINGS

The above object and other features of the present invention will become more apparent by describing the preferred embodiment thereof with reference to the accompanying drawings, in which.

DETAILED DESCRIPTION OF PREFERRED EMBODIMENTS

Figure 1:
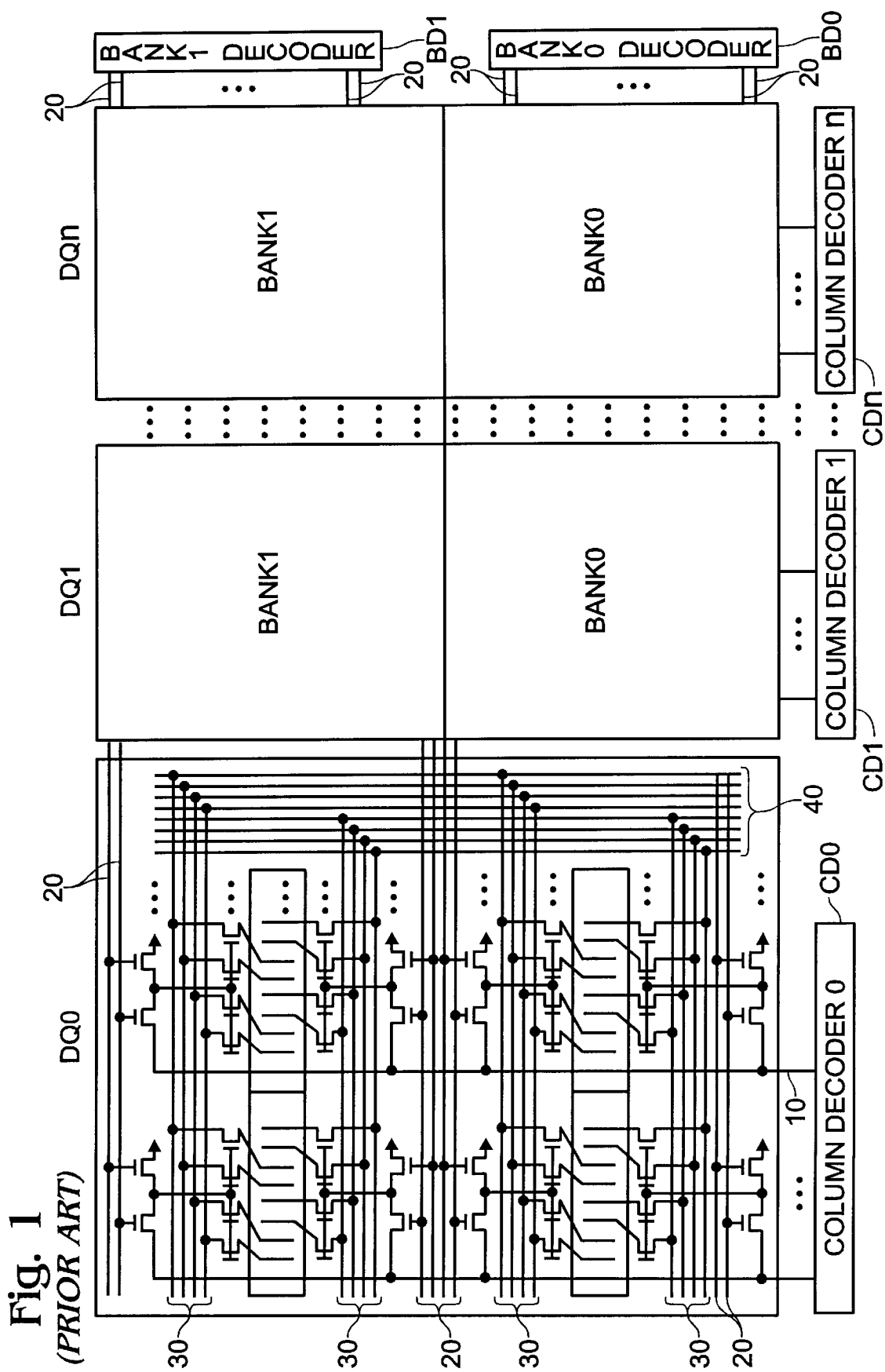
FIG. 1 is a block diagram of a prior art semiconductor memory device having a multiple bank structure.
Figure 2:
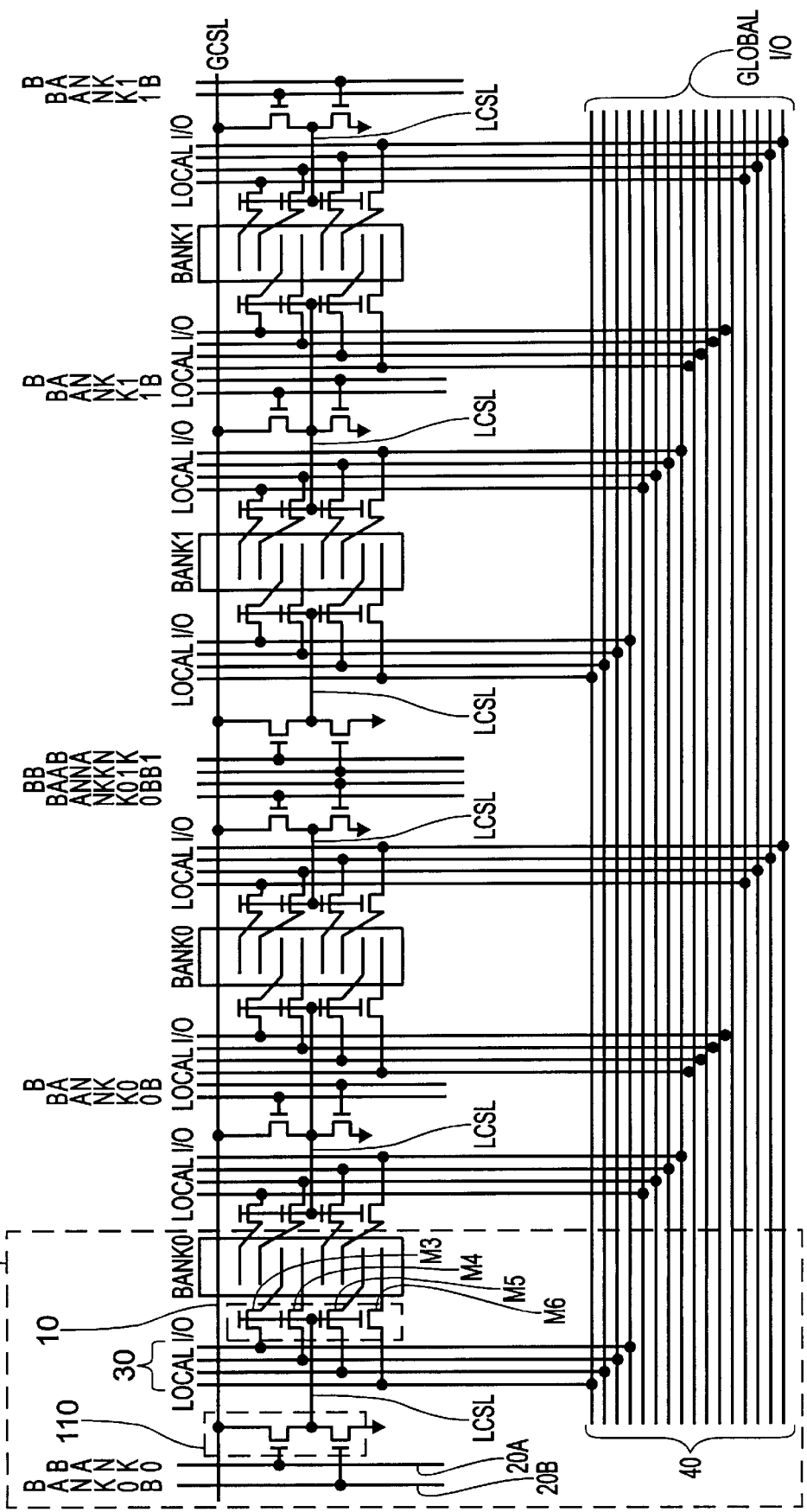
FIG. 2 is a schematic circuit diagram of a prior art multiple bank memory device.
Figure 3:
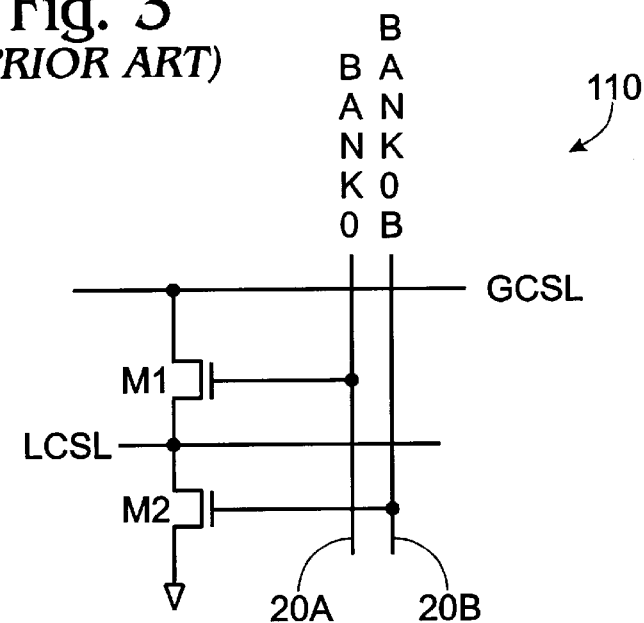
FIG. 3 is a schematic circuit diagram of a prior art local column selection line driver.
Figure 4:
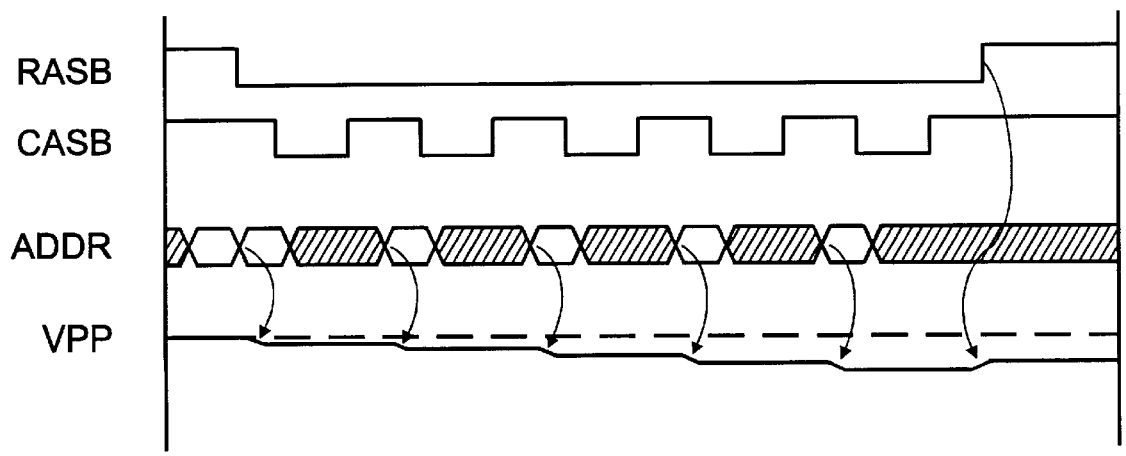
FIG. 4 is a timing diagram illustrating the operation of the prior art semiconductor memory device having a multiple bank structure of FIGS. 1–3.
Figure 5:
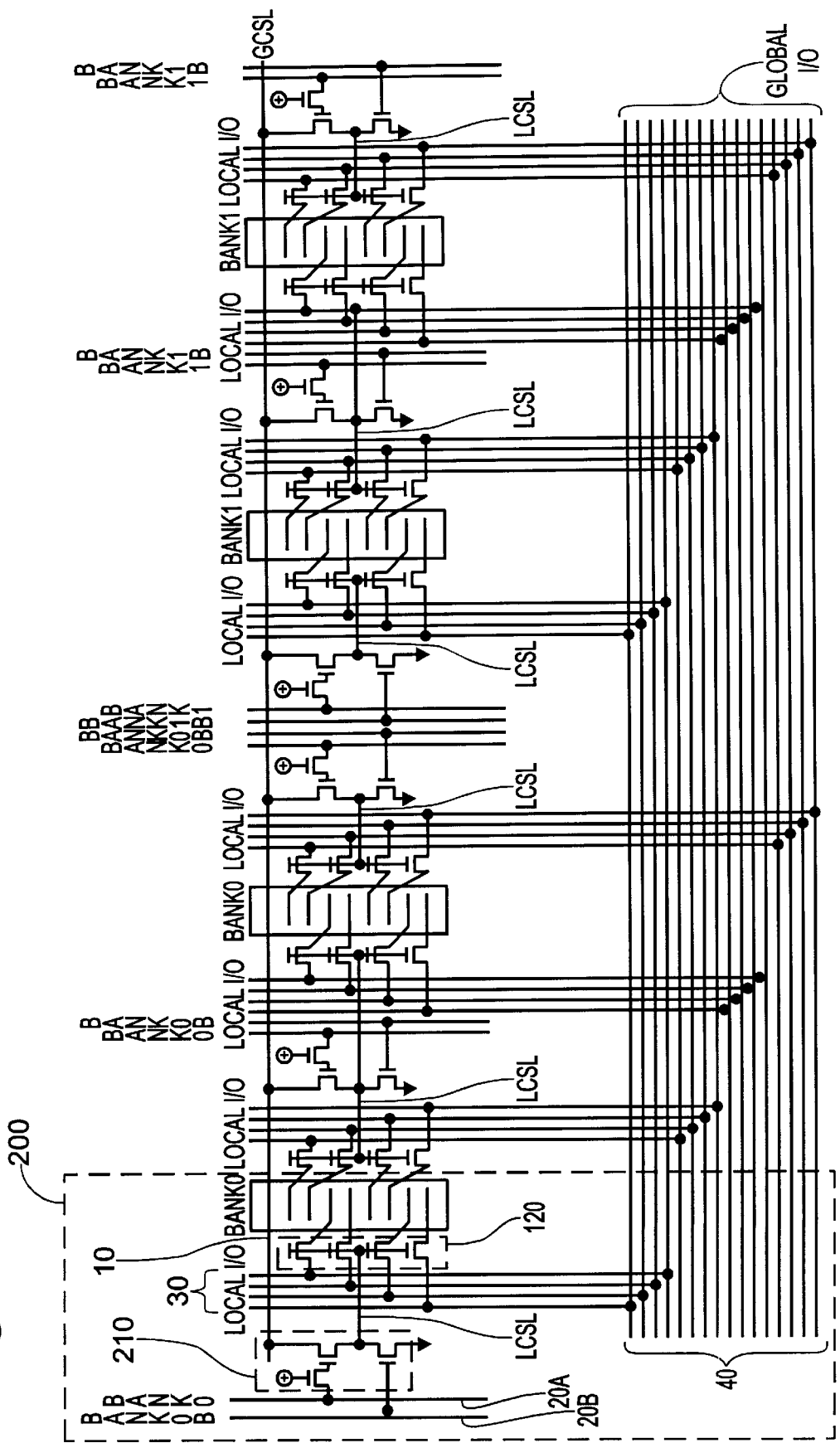
FIG. 5 is a schematic circuit diagram of a semiconductor memory device having a multiple bank structure according to one embodiment of the present invention.

FIG. 5 is a schematic diagram of a multiple bank memory device according to an embodiment of the present invention. Referring to FIG. 5, there is a first bank BANK0 and a second bank BANK1 which are constructed by assembling the same subcircuits.

The subcircuit 200 of the present invention includes a local column selection line driving circuit 210 for producing a local column selection control signal LCSL in response to a non-inverted and inverted bank selection lines 20A and 20B and a global column selection line 10. The local column selection control signal LCSL then drives the column selection section 120, which couples the local input/output bus 30 and memory cells of the memory cell array for the selected memory bank, in order to output the content of the memory onto global input/output bus 40, as described above with regard to the prior art device.

Figure 6:
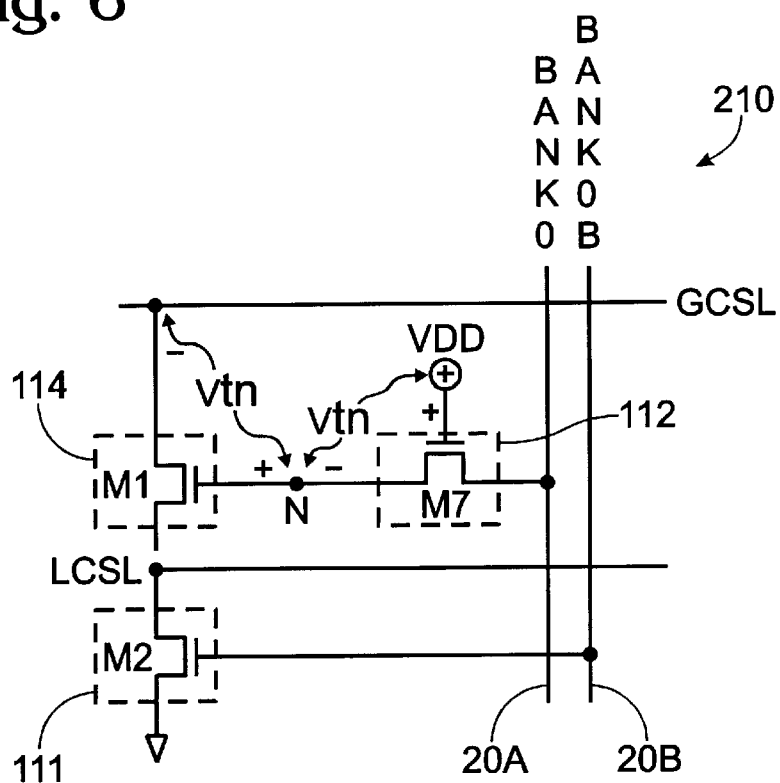
FIG. 6 is a circuit diagram illustrating an embodiment of a local column selection line driver according to the present invention.

FIG. 6 is a circuit diagram illustrating an embodiment of the local column selection line driving circuit 210 according to the present invention. Referring to FIG. 6, the local column selection line driving circuit 210 includes NMOS transistor M2, coupled between the local column selection line LCSL and ground, which functions as a pull-down device for pulling down the voltage level of the local column selection line LCSL to the ground potential in response to a bank selection signal applied to the inverted bank selection line 20B. Local column selection line driving circuit 210 also includes NMOS transistor M1, coupled between the local column selection line LCSL and global column selection line 10, which functions as a pull up device for pulling up the voltage level of the local column selection line LCSL to the voltage level of the global column select line 10 in response to a bank selection signal applied to non-inverted bank selection line 20A. In addition, local column selection line driving circuit 210 includes NMOS transistor M7, coupled between the gate of transistor M1 and the non-inverted bank selection line 20A. The gate of transistor M7 is coupled to power supply voltage VDD such that it precharges a self-boosting node N, where node N is formed by the connection of the gate terminal of transistor M1 to a second terminal (drain or source) of transistor M7, to a voltage level that is lower than the power supply voltage VDD in response to an active edge of bank selection signal applied to the non-inverted bank selection line 20A. Once a memory bank has been selected causing the non-inverted bank selection line 20A to transition to the VDD voltage level, the global column selection line GCSL, when selected responsive to the column select signal CASB, will transition to the VDD voltage level and boost the voltage at self-boosting node N to a voltage level that is higher than the power supply voltage VDD.

The operation of the local column selection circuit of the multiple bank memory device according to the present invention as described above will now be explained in greater detail. First, when the VDD voltage level is applied to the gate terminal of NMOS transistor M7, the self-boosting node N is precharged from 0V to VDD−Vtn, where Vtn is the NMOS activation threshold voltage. Thereafter, because of the capacitive coupling between the drain and gate terminals of transistor M1, when the voltage level of the global column selection line 10 applied to the drain terminal of transistor M1 transitions from 0V to VDD, the self-boosting node N will be further boosted to a voltage level that is greater than VDD. Because the voltage level at the self-boosting node N is boosted to a level higher than VDD+Vtn, the voltage level of the global column selection line GCSL is fully transmitted to the local column selection line LCSL. As a result, the VPP voltage level is not required in order to access the memory cell arrays of the memory banks BANK0 and BANK1.

Figure 7:
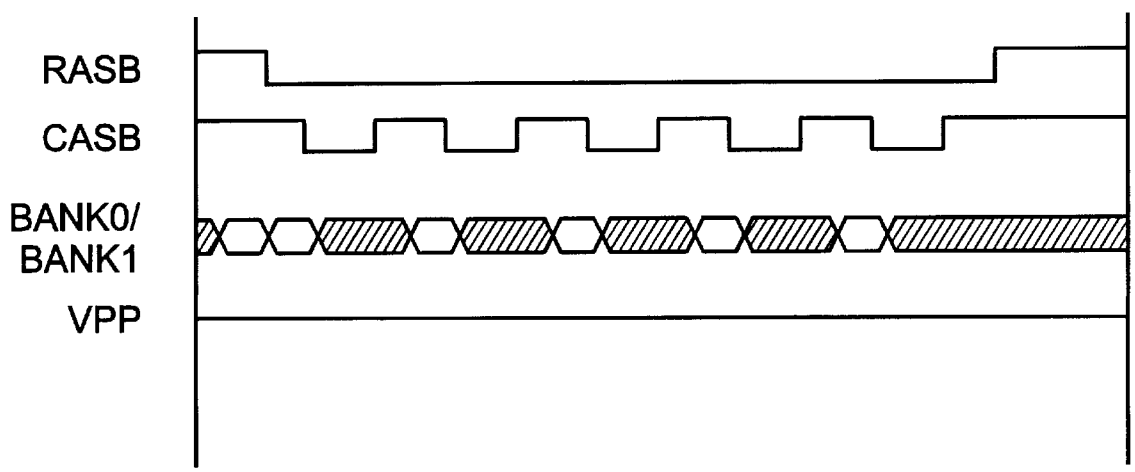
FIG. 7 is a timing diagram illustrating the operation of a semiconductor memory device having a multiple bank structure according to the present invention.

As shown in the timing diagram of FIG. 7, whenever the column address is designated after the row address strobe signal RASB transitions to the active low state, the VPP voltage level is maintained at a constant level, as opposed to the prior art device which experiences degradation of the VPP voltage level applied to the non-inverted bank selection line 20A.

From the foregoing, according to the present invention, a local column selection line driver circuit 210 having a self-boosting feature is used to drive the local column selection line LCSL instead of a VPP voltage level applied to the non-inverted bank selection line 20A. Therefore, when the column address is changed, thereby activating successive global column select lines GCSL, the charge consumption of the bank information voltage caused by loading the non-inverted bank selection line 20A is compensated resulting in a reduced loading effect on the non-inverted bank selection line 20A. Thus, the set-up margin for the bank address is improved as well as data access failure being avoided, thereby stabilizing the memory device.

While the present invention has been described and illustrated with reference to the embodiments above, it is to be readily understood that the present invention is not limited to these embodiments, and various changes and modifications can be made therein without departing from the spirit and scope of the invention defined in the appended claims.

What is claimed is:

1. A multi-bank memory device comprising:

a plurality of memory blocks, each memory block having first and second memory banks, where each of the first and second memory banks is composed of an array of memory cells arranged in rows and columns;

a first row decoder generating a first plurality of bank selection signals of a CMOS level for output to the first bank of each of the plurality of memory blocks, wherein the first plurality of bank selection signals is configured to select one of the rows of the array of memory cells in the first bank of each of the plurality of memory blocks;

a second row decoder generating a second plurality of bank selection signals of a CMOS level for output to the second bank of each of the plurality of memory blocks, wherein the second plurality of bank selection signals is configured to select one of the rows of the array of memory cells in the second bank of each of the plurality of memory blocks;

a plurality of column decoders, wherein each one of the plurality of column decoders produces a plurality of global column selection signals of the CMOS level or a plurality of global column selection lines for output to a corresponding one of the plurality of memory blocks and is further configured to select one of the columns of the array of memory cells in the first and second banks of the corresponding one of the plurality of memory blocks;

a plurality of global input/output lines wherein each one of the plurality of global input/output lines is coupled to a corresponding column in the array of memory cells in the first and second banks of one of the plurality of memory blocks;

a plurality of local input/output lines wherein each one of the plurality of local input/output lines couples one of the plurality of global input/output lines to the corresponding column in the array of memory cells in the first and second banks of one of the plurality of memory blocks;

a plurality of local column selection lines wherein each one of the plurality of local column selection lines controls one of a plurality of column selection section circuits which are coupled to the corresponding columns of the memory blocks; and a plurality of local column selection line circuits wherein each one of the plurality of local column selection line circuits couples one of the plurality of global column selection lines to a corresponding one of the plurality of local column selection lines, and wherein each one of the plurality of local column selection line circuits is configured to drive the corresponding one of the plurality of local column selection lines with the voltage of the CMOS level applied to the corresponding global column selection line in response to a corresponding pair of one of the first and second pluralities of bank selection signals.

2. The multi-bank memory device according to claim 1, wherein each one of the plurality of local column selection line circuits further comprises:

a first N-channel MOS (NMOS) transistor having a first terminal coupled to the corresponding one of the plurality of local column selection lines, a second terminal coupled to a ground potential terminal, and a gate terminal coupled to an inverting one of the corresponding pair of one of the first and second pluralities of bank selection signals and which pulls down a voltage level of the local column selection line in response to the inverting one of the corresponding pair of one of the first and second pluralities of bank selection signals;

a second NMOS transistor having a first terminal coupled to the corresponding one of the global column selection lines, a second terminal coupled to the corresponding one of the plurality of local column selection lines, and a gate terminal; and a third NMOS transistor having a first terminal coupled to a non-inverting one of the corresponding pair of one of the first and second pluralities of bank selection signals, a second terminal coupled to the gate terminal of the second NMOS transistor, and a gate terminal for receiving a power supply voltage, such that the third NMOS transistor precharges the gate terminal of the second NMOS transistor to a voltage level lower than the power supply voltage in response to an active edge of the non-inverting one of the first and second pluralities of bank selection signals whereby the voltage level at the gate terminal of the second NMOS transistor is boosted above the power supply voltage responsive to an active edge received on the corresponding one of the global column selection signals applied to the one of the global column selection lines coupled to the first terminal of the second NMOS transistor.

3. The multi-bank memory device according to claim 1, wherein the memory cell array of each of the first and second banks of each one of the plurality of memory blocks is arranged into a plurality of array groups having a 2×2 pattern.

4. The multi-bank memory device according to claim 3, wherein the array group further comprises four cell sub-arrays.

5. The multi-bank memory device according to claim 4, wherein each one of the cell sub-arrays of each array group is arranged between a corresponding pair of the plurality of local input/output lines.

6. The multi-bank memory device according to claim 4, wherein the cell sub-arrays of each array group are arranged alternately with one another.

\* \* \* \* \*

UNITED STATES PATENT AND TRADEMARK OFFICE
CERTIFICATE OF CORRECTION

PATENT NO.    : 5,930,196
DATED         : July 27, 1999
INVENTOR(S)   : Yim

It is certified that error appears in the above-identified patent and that said Letters Patent is hereby corrected as shown below:

Column 6,
Line 6, "or" should read -- on --.

Signed and Sealed this

Twenty-second Day of October, 2002

Attest:

Attesting Officer

JAMES E. ROGAN
Director of the United States Patent and Trademark Office